United States Patent
Yamada et al.

(10) Patent No.: US 10,312,133 B2
(45) Date of Patent: Jun. 4, 2019

(54) METHOD OF MANUFACTURING SILICON ON INSULATOR SUBSTRATE

(71) Applicants: TOYOTA JIDOSHA KABUSHIKI KAISHA, Toyota-shi, Aichi-ken (JP); SUMCO CORPORATION, Tokyo (JP)

(72) Inventors: Tetsuya Yamada, Seto (JP); Hiromichi Kinpara, Seto (JP); Shinjirou Uchida, Tokyo (JP); Masamitsu Fukuda, Tokyo (JP)

(73) Assignees: TOYOTA JIDOSHA KABUSHIKI KAISHA, Toyota (JP); SUMCO CORPORATION, Tokyo (JP)

( * ) Notice: Subject to any disclaimer, the term of this patent is extended or adjusted under 35 U.S.C. 154(b) by 0 days.

(21) Appl. No.: 15/459,404

(22) Filed: Mar. 15, 2017

(65) Prior Publication Data

US 2017/0278741 A1   Sep. 28, 2017

(30) Foreign Application Priority Data

Mar. 23, 2016   (JP) ................................. 2016-059090

(51) Int. Cl.
  *H01L 21/265* (2006.01)
  *H01L 21/266* (2006.01)
  (Continued)

(52) U.S. Cl.
  CPC ...... *H01L 21/76243* (2013.01); *H01L 21/266* (2013.01); *H01L 21/26533* (2013.01);
  (Continued)

(58) Field of Classification Search
  CPC ......... H01L 21/02532; H01L 21/02381; H01L 21/0245; H01L 21/266;
  (Continued)

(56) References Cited

U.S. PATENT DOCUMENTS 6,579,359 B1 *  6/2003  Mynbaeva ............. C30B 25/02
                                                  117/107
6,831,345 B2 * 12/2004  Kinoshita ........... H01L 29/0619
                                                  257/472

(Continued)

FOREIGN PATENT DOCUMENTS

JP    H02-069974 A    3/1990
JP    H07-263539 A   10/1995
(Continued)

*Primary Examiner* — Stephen M Bradley
(74) *Attorney, Agent, or Firm* — Oliff PLC

(57) ABSTRACT

A method of manufacturing a silicon on insulator substrate includes: preparing a semiconductor substrate including a rear side semiconductor layer, an insulating layer, and a front side semiconductor layer, a first surface of the insulating layer being in contact with a surface of the rear side semiconductor layer, and a first surface of the front side semiconductor layer being in contact with a second surface of the insulating layer; forming a high concentration region in which an impurity concentration is increased in the front side semiconductor layer, by injecting impurities into the front side semiconductor layer; heating the semiconductor substrate having the high concentration region; and epitaxially growing an additional semiconductor layer on a second surface of the front side semiconductor layer of the heated semiconductor substrate, the additional semiconductor layer having a lower impurity concentration than the high concentration region.

7 Claims, 6 Drawing Sheets

(51) Int. Cl.
   *H01L 21/324* (2006.01)
   *H01L 21/761* (2006.01)
   *H01L 21/762* (2006.01)
(52) U.S. Cl.
   CPC .......... *H01L 21/324* (2013.01); *H01L 21/761* (2013.01); *H01L 21/7624* (2013.01)
(58) Field of Classification Search
   CPC .......................... H01L 21/342–21/3247; H01L 21/7624–21/76297
   See application file for complete search history.

(56) References Cited

U.S. PATENT DOCUMENTS

| | | | | |
|---|---|---|---|---|
| 2008/0246084 | A1* | 10/2008 | Ono | H01L 29/0634 257/341 |
| 2009/0104752 | A1 | 4/2009 | Yoshida et al. | |
| 2009/0230515 | A1* | 9/2009 | Miyahara | H01L 29/0878 257/632 |
| 2010/0062588 | A1* | 3/2010 | Murakanni; Yoshio | H01L 21/02422 438/481 |
| 2013/0102126 | A1* | 4/2013 | Aga | H01L 21/76254 438/458 |
| 2016/0086799 | A1* | 3/2016 | Hiyoshi | H01L 21/02378 257/77 |
| 2016/0148834 | A1 | 5/2016 | Yamada | |
| 2017/0186695 | A1* | 6/2017 | Moser | H01L 21/266 |

FOREIGN PATENT DOCUMENTS

| | | |
|---|---|---|
| JP | H09-008310 A | 1/1997 |
| JP | H11-274312 A | 10/1999 |
| JP | 2007-142135 A | 6/2007 |
| JP | 2007-165575 A | 6/2007 |
| JP | 2007-173422 A | 7/2007 |
| JP | 2016-100566 A | 5/2016 |
| WO | 2007/125771 A1 | 11/2007 |

\* cited by examiner

METHOD OF MANUFACTURING SILICON ON INSULATOR SUBSTRATE

INCORPORATION BY REFERENCE

The disclosure of Japanese Patent Application No. 2016-059090 filed on Mar. 23, 2016 including the specification, drawings and abstract is incorporated herein by reference in its entirety.

BACKGROUND

1. Technical Field

A method of manufacturing a silicon on insulator (hereinafter referred to as SOI) substrate is disclosed in this specification.

2. Description of Related Art

In Japanese Patent Application Publication No. 2007-173422 (JP 2007-173422 A), a semiconductor device using an SOI substrate is disclosed. The SOI substrate has a structure in which an insulating layer is in contact with a surface of a rear side semiconductor layer and a device layer is in contact with a surface of the insulating layer. In this specification, a semiconductor layer on a side on which a semiconductor element structure that is operated as a diode, a switching element, or the like is fabricated is called a device layer. The insulating layer not only covers the surface of the rear side semiconductor layer but also covers a side surface and a rear surface of the rear side semiconductor layer in some cases. When the insulating layer covers the entire surface of the rear side semiconductor layer, the insulating layer is called a box layer.

In the semiconductor device in JP 2007-173422 A, in a region in the vicinity of a rear surface of the device layer (in the vicinity of an interface between the device layer and the box layer), a high concentration region having a higher impurity concentration than a surface side is provided. When the high concentration region is provided in the vicinity of the rear surface of the device layer, a withstand pressure of the semiconductor device in a vertical direction (that is, a withstand pressure in a direction from the device layer to the rear side semiconductor layer) is improved.

SUMMARY

When an SOI substrate in which a high concentration region is provided in the vicinity of a rear surface of a device layer is used, it is possible to easily manufacture a semiconductor device having a high withstand pressure in a vertical direction.

When impurities are injected into the vicinity of the rear surface of the device layer of the SOI substrate before the high concentration region is formed and a heat treatment is then performed, it is possible to manufacture the SOI substrate in which the high concentration region is provided in the vicinity of the rear surface of the device layer. However, according to this manufacturing method, during the heat treatment, impurities diffuse from a region in the vicinity of the rear surface of the device layer to a region in the vicinity of a surface. Therefore, when a semiconductor element is formed in the device layer thereafter, it is not possible to control a characteristic of the semiconductor element to be a desired characteristic due to an influence of the impurities diffused in the vicinity of the surface of the device layer. Accordingly, in this specification, a method of manufacturing an SOI substrate through which it is possible to suppress impurities from diffusing to the vicinity of the surface of the device layer is disclosed.

According to the manufacturing method disclosed in this specification, the SOI substrate including a high concentration region in the vicinity of the rear surface of the device layer is manufactured. A method of manufacturing a silicon on insulator substrate, according to an aspect of the disclosure includes: preparing a semiconductor substrate including a rear side semiconductor layer, an insulating layer, and a front side semiconductor layer, a first surface of the insulating layer being in contact with a surface of the rear side semiconductor layer, and a first surface of the front side semiconductor layer being in contact with a second surface of the insulating layer; forming a high concentration region in which an impurity concentration is increased in the front side semiconductor layer, by injecting impurities into the front side semiconductor layer; heating the semiconductor substrate having the high concentration region; and epitaxially growing an additional semiconductor layer on a second surface of the front side semiconductor layer of the heated semiconductor substrate, the additional semiconductor layer having a lower impurity concentration than the high concentration region. When the high concentration region is formed, impurities may be injected into the entire surface of a front side semiconductor layer or impurities may be injected in a local range.

In the manufacturing method, when impurities are injected into the front side semiconductor layer, the high concentration region is formed in the front side semiconductor layer and the SOI substrate is then heated. Accordingly, impurities are diffused in the front side semiconductor layer. Since no additional semiconductor layer is formed in the heat treatment process, impurities do not diffuse from the front side semiconductor layer to the additional semiconductor layer during the heat treatment. Therefore, the heat treatment can be performed without consideration of impurity diffusion from the front side semiconductor layer to the additional semiconductor layer and it is possible to sufficiently diffuse impurities in a thickness direction of the front side semiconductor layer. Accordingly, it is possible to form the high concentration region in which an impurity concentration is sufficiently uniform in the thickness direction. Next, the additional semiconductor layer having a low impurity concentration is epitaxially grown on the surface of the front side semiconductor layer. The front side semiconductor layer and the additional semiconductor layer form the device layer. In the epitaxial growing process, although the SOI substrate is heated to a high temperature, a processing time necessary for epitaxially growing the additional semiconductor layer with a thickness necessary for forming a semiconductor element (for example, about several μm) is short. That is, in the epitaxial growing process, a time for which the SOI substrate is exposed at a high temperature is short. Accordingly, diffusion of impurities from the high concentration region of the front side semiconductor layer to the additional semiconductor layer hardly occurs. Accordingly, it is possible to form the additional semiconductor layer having a low impurity concentration. According to this manufacturing method, it is possible to manufacture the SOI substrate in which a high concentration region is formed in a region in the vicinity of the rear surface of the device layer (that is, the front side semiconductor layer) and an impurity concentration of a region in the vicinity of the surface of the device layer (that is, the additional semiconductor layer) is low. It is possible to manufacture a semiconductor device having a high withstand pressure in the vertical direction and having excellent characteristics using this SOI substrate.

BRIEF DESCRIPTION OF THE DRAWINGS

Features, advantages, and technical and industrial significance of exemplary embodiments of the present disclosure will be described below with reference to the accompanying drawings, in which like numerals denote like elements, and wherein.

DETAILED DESCRIPTION OF EMBODIMENTS

Figure 1:
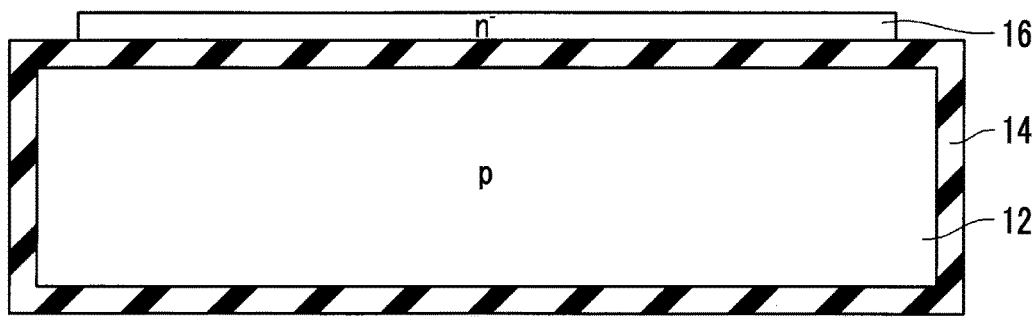
FIG. 1 is a vertical cross-sectional view of an semiconductor substrate 10.

In a manufacturing method of Example 1, an semiconductor substrate 10 shown in FIG. 1 is prepared. The semiconductor substrate 10 includes a rear side semiconductor layer 12, a box layer 14, and a front side semiconductor layer 16. The rear side semiconductor layer 12 includes p-type silicon. The box layer 14 is an insulating layer including a silicon oxide. The box layer 14 covers the entire surface of the rear side semiconductor layer 12. The box layer 14 can be formed by a method known in the related art. For example, when a surface of the rear side semiconductor layer 12 (that is, a semiconductor wafer including p-type silicon) before the box layer 14 is formed is oxidized, the box layer 14 can be formed. The front side semiconductor layer 16 includes n-type silicon. The front side semiconductor layer 16 is fixed to a surface of the box layer 14. The thickness of the front side semiconductor layer 16 is 0.5 to 1.0 μm. The front side semiconductor layer 16 can be formed by a method known in the related art. For example, the front side semiconductor layer 16 can be formed by attaching a semiconductor wafer including n-type silicon to the box layer 14.

Figure 2:
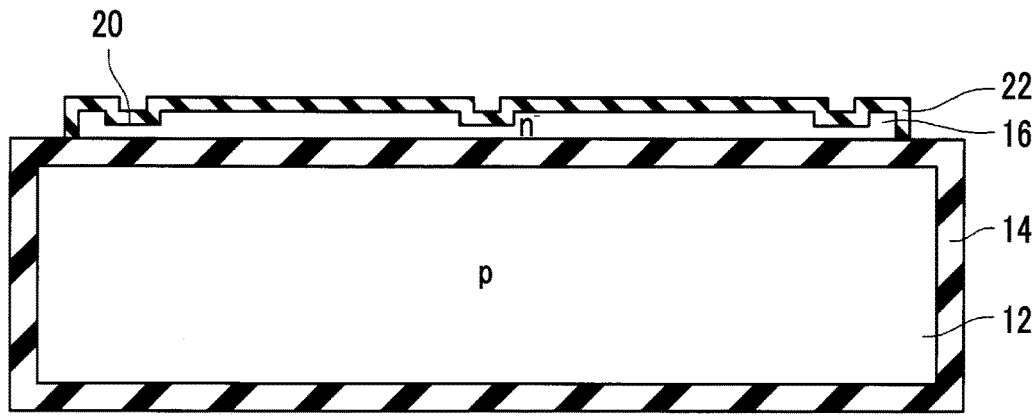
FIG. 2 is a vertical cross-sectional view of an semiconductor substrate 10 in which an oxide film 22 is formed.

First, as shown in FIG. 2, the front side semiconductor layer 16 is partially etched to form an alignment mark (a concave portion) 20 on a surface of the front side semiconductor layer 16. Next, an oxide film 22 is formed on the surface of the front side semiconductor layer 16. Here, the oxide film 22 is formed by a thermal oxidation method or a chemical vapor deposition (CVD) method. Since the oxide film 22 is formed with a substantially uniform thickness, a concave portion is formed along the alignment mark 20 on a surface of the oxide film 22.

Figure 3:
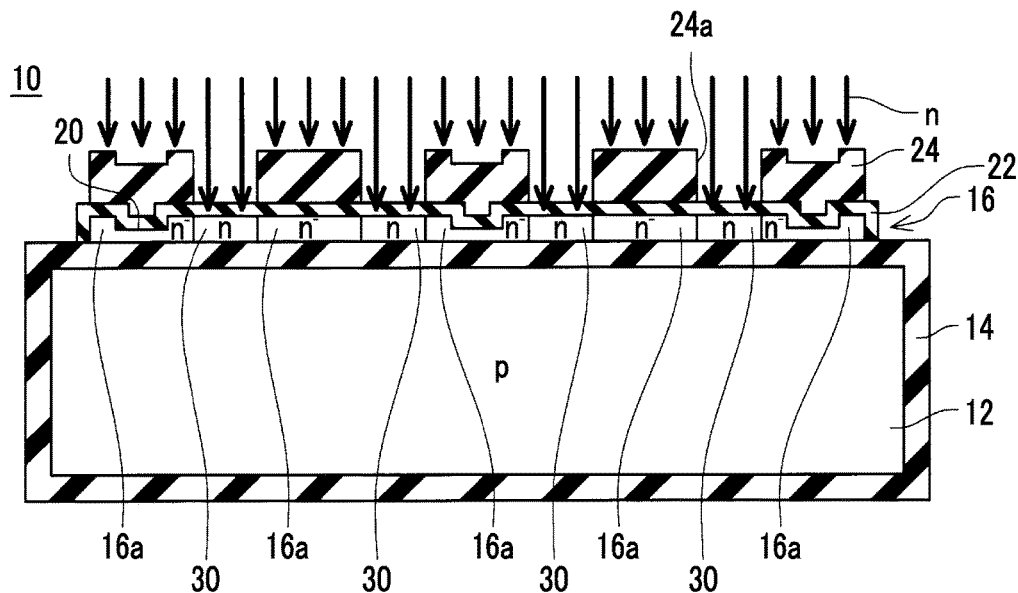
FIG. 3 is a vertical cross-sectional view showing injection of n-type impurities into a front side semiconductor layer 16.

Next, as shown in FIG. 3, a resist mask 24 is formed on the surface of the oxide film 22. A concave portion is formed on a surface of the resist mask 24 along the alignment mark 20. Next, an opening 24a is formed on the resist mask 24. The opening 24a can be formed by adjusting a position using the alignment mark 20 (more specifically, a concave portion in the surface of the resist mask 24) as a reference. Next, n-type impurity ions (for example, As) are emitted toward the front side semiconductor layer 16 through the resist mask 24. Here, the n-type impurities are emitted at an energy of about 60 keV. The n-type impurities are injected into the front side semiconductor layer 16 through the oxide film 22 in the opening 24a. Therefore, an n-type impurity concentration in the front side semiconductor layer 16 in the opening 24a increases. Accordingly, as shown in FIG. 3, a plurality of high concentration regions 30 (that is, regions in which the n-type impurity concentration is increased with respect to the original front side semiconductor layer 16) are formed in the front side semiconductor layer 16.

Figure 4:
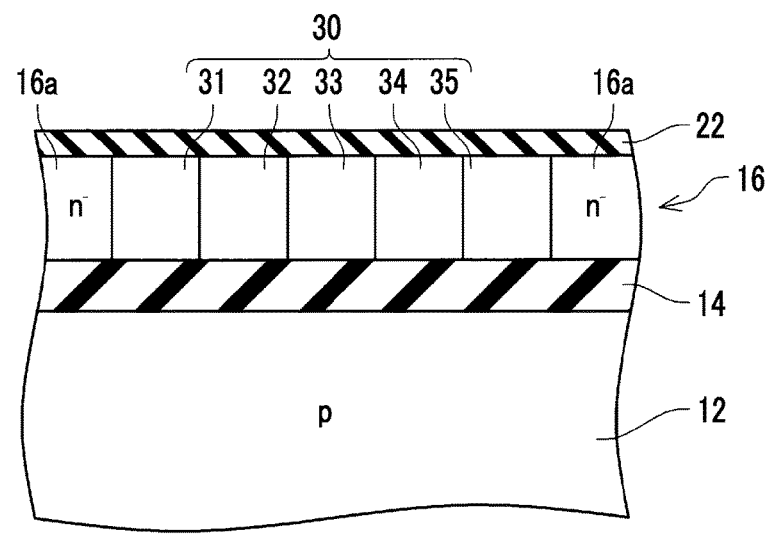
FIG. 4 is an enlarged cross-sectional view of a high concentration region 30.

Also, here, a cycle including formation of the resist mask 24, injection of n-type impurities and removal of the resist mask 24 is repeated a plurality of times (for example, three times). In the cycles, the shape of the opening 24a is changed. In addition, in the cycles, a dose amount (an areal density of impurities) in the process of injecting n-type impurities is changed. The dose amount is changed in a range of $0.5 \times 10^{11}$ to $5.0 \times 10^{12}$ cm$^{-2}$. When impurities are injected for a plurality of cycles while conditions are changed in this manner, as shown in FIG. 4, regions 31 to 35 whose n-type impurity concentrations are different from each other are formed in the high concentration region 30. In this example, in the high concentration region 30, the region 35 has the highest n-type impurity concentration, and the n-type impurity concentration decreases in a stepwise manner away from the region 35. Also, a low concentration region 16a in FIGS. 3 and 4 is a region in which no n-type impurities are injected in the cycles and an n-type impurity concentration of the original front side semiconductor layer 16 is maintained.

Also, in the process of injecting n-type impurities in the cycles, the oxide film 22 prevents metal contamination of the front side semiconductor layer 16 and prevents channeling.

Figure 5:
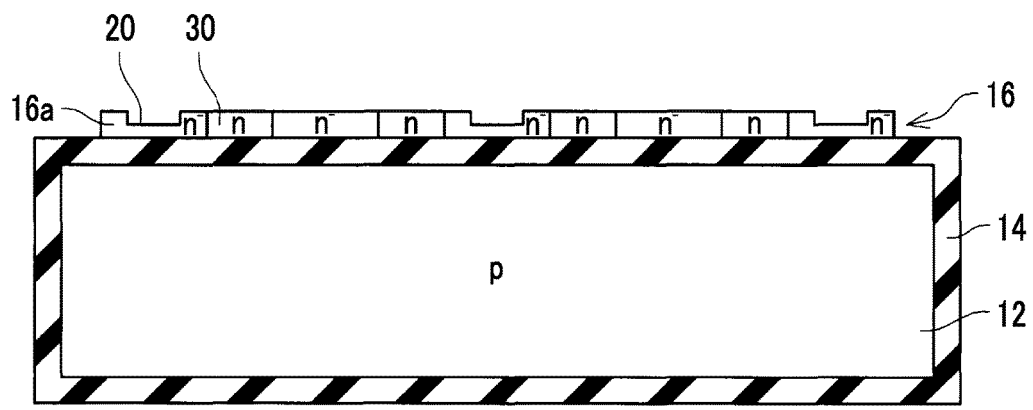
FIG. 5 is a vertical cross-sectional view of an semiconductor substrate 10 after the oxide film 22 is removed.

Next, the semiconductor substrate 10 is heated in a furnace. Here, the semiconductor substrate 10 is left at 1000 to 1200° C. for 3 to 6 hours. When the heat treatment ends, as shown in FIG. 5, the oxide film 22 is removed by wet etching and the like.

According to the above-described heat treatment, the n-type impurities injected into the front side semiconductor layer 16 diffuse and are activated. Here, a temperature and a time for the heat treatment process are adjusted so that an average diffusion length of the n-type impurities in the front side semiconductor layer 16 is twice the thickness of the front side semiconductor layer 16 or more. For example, the average diffusion length of the n-type impurities can be set to about 1 to 2 μm. When the average diffusion length of the n-type impurities is twice the thickness of the front side semiconductor layer 16 or more, most of the n-type impurities diffusing in the front side semiconductor layer 16 in a thickness direction thereof make one or more round trips between an upper end and a lower end of the front side semiconductor layer 16. Therefore, after the heat treatment, the n-type impurity concentration in the high concentration region 30 is substantially uniform in the thickness direction. That is, in a profile in the thickness direction of the n-type impurity concentration in the high concentration region 30, a concentration difference is extremely small. According to this method, it is possible to form the high concentration region 30 in which the n-type impurity concentration has a uniform distribution in the thickness direction. Also, during the heat treatment, the n-type impurities also diffuse in a lateral direction. However, before the heat treatment, the n-type impurity concentration is distributed to decrease from the region 35 to the region 31, and a distance from the region 35 to the region 31 is sufficiently longer than a diffusion length of the n-type impurities. Therefore, even after the heat treatment is performed, the n-type impurity concentration is distributed to decrease from the region 35 to the region 31.

Figure 6:
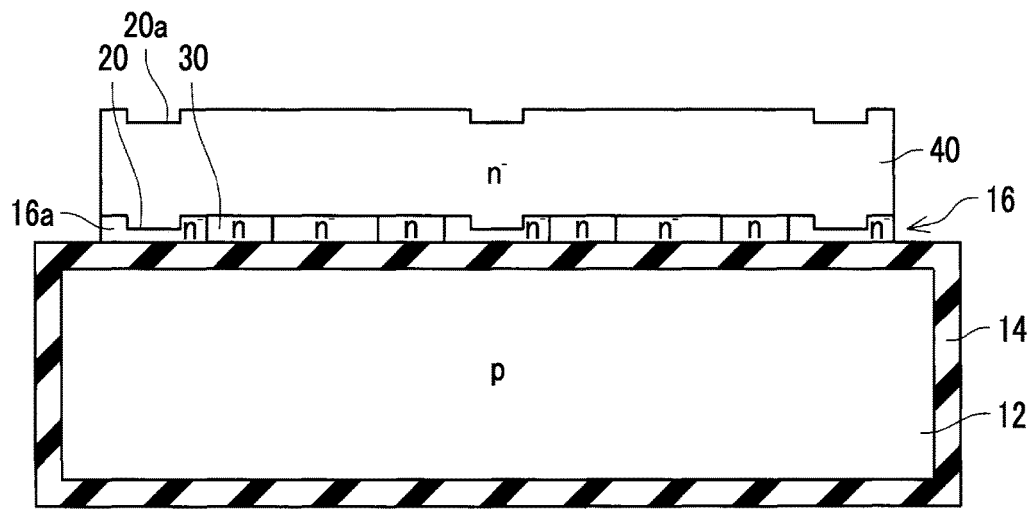
FIG. 6 is a vertical cross-sectional view of an SOI substrate after an additional semiconductor layer 40 is formed.

Next, as shown in FIG. 6, an additional semiconductor layer 40 is epitaxially grown on the front side semiconductor layer 16. The additional semiconductor layer 40 is formed thicker than the front side semiconductor layer 16. For example, the thickness of the additional semiconductor layer 40 can be set to about 1 to 12 μm. The additional semiconductor layer 40 includes n-type silicon. An n-type impurity concentration of the additional semiconductor layer 40 is lower than an n-type impurity concentration of the high concentration region 30 (for example, an n-type impurity concentration of the region 31). Note that a concave portion 20a is formed in the surface of the front side semiconductor layer 16 along the alignment mark 20.

The additional semiconductor layer 40 and the front side semiconductor layer 16 constitute a device layer. When the additional semiconductor layer 40 is formed, an SOI substrate is completed.

Note that, when the additional semiconductor layer 40 is epitaxially grown, the SOI substrate is heated to a high temperature (about 1200° C.). However, the thickness of the additional semiconductor layer 40 necessary to form a semiconductor element is about 1 to 12 μm as described above and an additional semiconductor layer having such a thickness can be grown in a short time (for example, about several minutes). In the epitaxial growing process, since the SOI substrate is heated for a short time, n-type impurities hardly diffuse from the high concentration region 30 to the additional semiconductor layer 40. Accordingly, it is possible to form the additional semiconductor layer 40 having a low n-type impurity concentration.

As described above, according to this manufacturing method, it is possible to manufacture the SOI substrate in which the high concentration region 30 is formed in a region in the vicinity of the lower end of the device layer (that is, the front side semiconductor layer 16) and an impurity concentration in a region in the vicinity of the surface of the device layer (that is, the additional semiconductor layer 40) is low.

In addition, according to this manufacturing method, it is possible to increase the thickness of the device layer (that is, the sum of the thickness of the front side semiconductor layer and the thickness of the additional semiconductor layer). In a method in which impurities are injected at a surface of a completed device layer to form a high concentration region in the related art, when the device layer is thick, it is necessary to set an impurity injection energy to be higher and increase an impurity injection depth. Since the impurity injection energy is limited, the thickness of the device layer is limited due to the impurity injection energy. On the other hand, in the method of this example, since the additional semiconductor layer 40 is formed after the high concentration region 30 is formed, it is possible to set the thickness of the additional semiconductor layer regardless of energy for injecting impurities to the high concentration region 30. Therefore, according to this method, it is possible to manufacture the SOI substrate with a thick device layer.

In addition, according to this manufacturing method, during mass production of the SOI substrate, a variation in the n-type impurity concentration of the high concentration region 30 is unlikely to occur and a variation in the n-type impurity concentration of the additional semiconductor layer 40 is unlikely to occur. Accordingly, when a semiconductor device is manufactured using the SOI substrate, it is possible to minimize a variation in characteristics of the semiconductor device.

Also, it is possible to manufacture a semiconductor device as follows using the SOI substrate.

Figure 7:
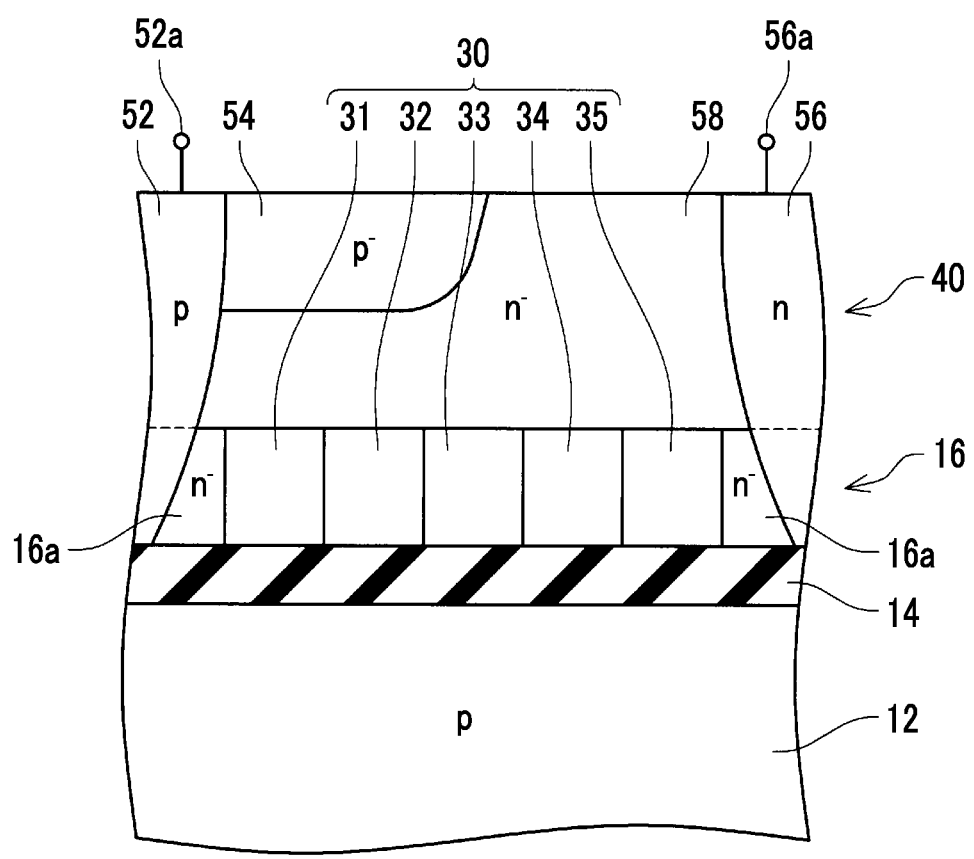
FIG. 7 is an enlarged cross-sectional view showing a configuration of a diode.

P-type and n-type impurities are injected into the additional semiconductor layer 40 to form a semiconductor element on the additional semiconductor layer 40. In Example 1, as shown in FIG. 7, a diode is formed above each of the high concentration regions 30. In FIG. 7, an n-type cathode region 56 is provided from the additional semiconductor layer 40 to the front side semiconductor layer 16. The cathode region 56 is connected to a cathode electrode 56a. In addition, at a position away from the cathode region 56, from the additional semiconductor layer 40 to the front side semiconductor layer 16, a p-type anode region 52 is provided. The anode region 52 is connected to an anode electrode 52a. In addition, a p-type region 54 is provided in a surface layer portion of a range adjacent to the anode region 52. A p-type impurity concentration of the p-type region 54 is lower than a p-type impurity concentration of the anode region 52. An n-type drift region 58 is formed in a range between the cathode region 56 and the anode region 52. The drift region 58 is a region in which a concentration of the original additional semiconductor layer 40 is maintained. The cathode region 56, the anode region 52, the p-type region 54 and the drift region 58 constitute the diode. The high concentration region 30 is provided below the drift region 58. The n-type impurity concentration in the high concentration region 30 decreases from the cathode region 56 to the anode region 52.

The cathode region 56 is formed by injecting n-type impurities into the additional semiconductor layer 40. The anode region 52 and the p-type region 54 are formed by injecting p-type impurities into the additional semiconductor layer 40. An activation treatment of impurities injected into the additional semiconductor layer 40 is preferably performed by a method in which a heating time is short and impurities do not easily diffuse, for example, flash lamp annealing or laser annealing.

After the above-described diode is formed, when the SOI substrate is diced, the semiconductor device having the diode is completed.

Since the n-type impurity concentration of the additional semiconductor layer 40 before the diode is formed is low, it is possible to reduce an n-type impurity concentration of the drift region 58 of the diode. Therefore, a resistance of the drift region 58 of the diode decreases and an on resistance of the diode decreases. Therefore, according to this method, it is possible to manufacture a semiconductor device including a diode having small loss.

In addition, in the semiconductor device manufactured by the above-described method, the high concentration region 30 is provided at a position adjacent to an interface between the box layer 14 and the front side semiconductor layer 16 below the drift region 58. When the high concentration region 30 is provided at this position, it is possible to improve a withstand pressure of the diode in a vertical direction (that is, a direction from the additional semiconductor layer 40 to the rear side semiconductor layer 12). In particular, since the n-type impurity concentration in the high concentration region 30 is distributed to decrease from the cathode region 56 to the anode region 52, it is possible to effectively improve the withstand pressure of the diode in the vertical direction. In particular, the thickness of the additional semiconductor layer 40 is greater than the thickness of the front side semiconductor layer 16 (that is, the high concentration region 30). In such a configuration, the withstand pressure of the diode in the vertical direction further increases.

Figure 8:
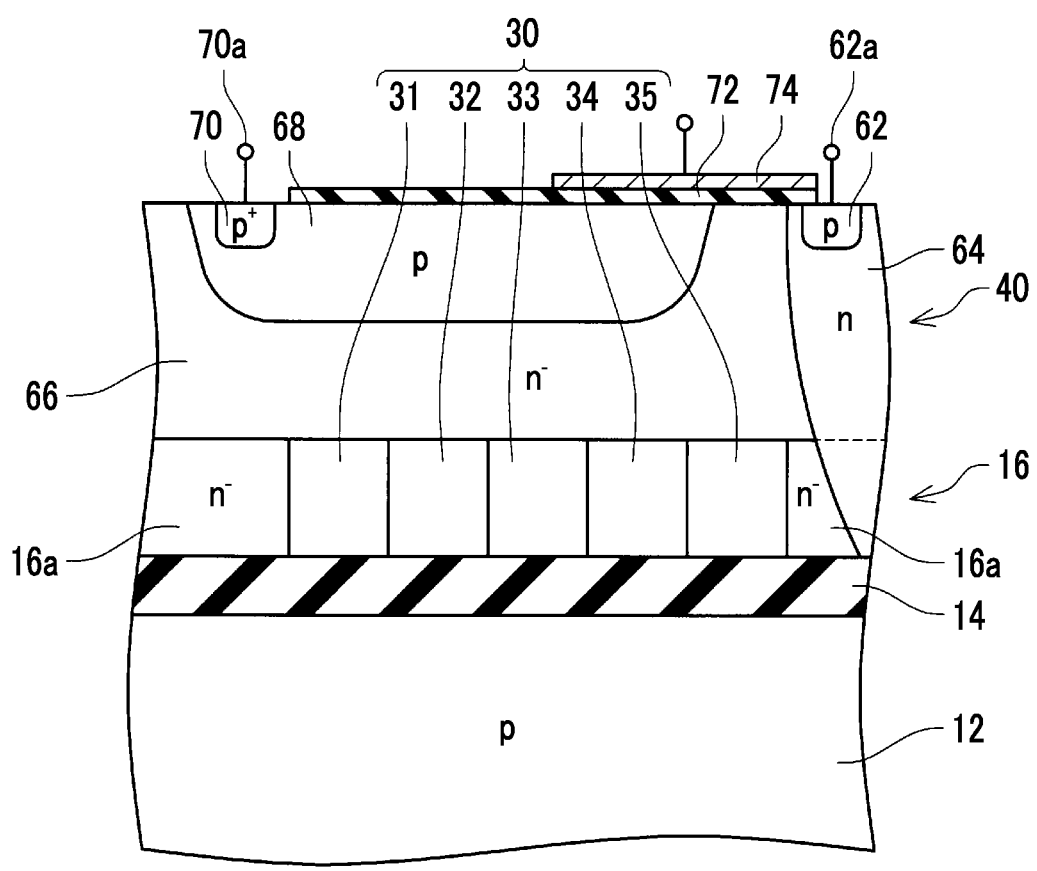
FIG. 8 is an enlarged cross-sectional view showing a configuration of a MOSFET.

In a manufacturing method of Example 2, in a semiconductor element forming process, an MOSFET shown in FIG. 8 is formed on the additional semiconductor layer 40. The other configurations in the manufacturing method of Example 2 are the same as those in the manufacturing method of Example 1.

In FIG. 8, a p-type source region 62 is formed in a surface layer portion of the additional semiconductor layer 40. The source region 62 is connected to a source electrode 62a. In addition, at a position adjacent to the source region 62, from the additional semiconductor layer 40 to the front side semiconductor layer 16, an n-type region 64 is formed. In addition, an n-type region 66 is formed in the additional semiconductor layer 40 at a position adjacent to the n-type region 64. P-type drain regions 68 and 70 are formed above the n-type region 66. The drain region 70 has a higher p-type impurity concentration than the drain region 68. The drain region 70 is connected to a drain electrode 70a. The source region 62 and the drain regions 68 and 70 are formed by injecting p-type impurities. The n-type region 64 is formed by injecting n-type impurities. The n-type region 66 is a region in which a concentration of the original additional semiconductor layer 40 is maintained. A gate insulating film 72 and a gate electrode 74 are formed on a surface of the additional semiconductor layer 40. The gate electrode 74, the gate insulating film 72, the source region 62, the n-type regions 64 and 66, and the drain regions 68 and 70 constitute the MOSFET. The high concentration region 30 is provided below the drift region 58. The n-type impurity concentration in the high concentration region 30 decreases from the source region 62 side to the drain region 70 side. After the MOSFET is formed, when the SOI substrate is diced, the semiconductor device having the MOSFET is completed.

According to the manufacturing method of Example 2, it is possible to decrease an n-type impurity concentration of the n-type region 66. In such a configuration, it is possible to improve a withstand pressure of the MOSFET in a lateral direction. In addition, it is possible to improve a withstand pressure of the MOSFET in the vertical direction by the high concentration region 30. In particular, since the thickness of the additional semiconductor layer 40 is greater than the thickness of the front side semiconductor layer 16 (that is, the high concentration region 30), a withstand pressure of the MOSFET in the vertical direction further increases. According to this method, it is possible to manufacture a semiconductor device including an MOSFET having a high withstand pressure.

In a manufacturing method of Example 3, epitaxial growing is repeatedly performed to form a laminate including a plurality of epitaxial layers. The additional semiconductor layer 40 includes the laminate. The other configurations in the manufacturing method of Example 3 are the same as those in the manufacturing method of Example 1.

Figure 9:
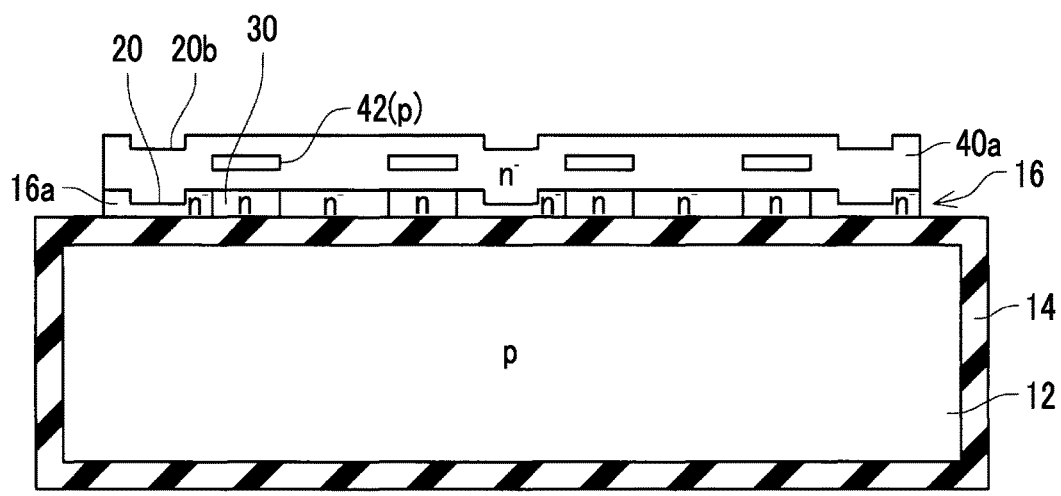
FIG. 9 is a vertical cross-sectional view after a first epitaxial layer 40a is formed.

In the manufacturing method of Example 3, in a forming process of the additional semiconductor layer 40, first, as shown in FIG. 9, a first epitaxial layer 40a is grown on the front side semiconductor layer 16. The first epitaxial layer 40a includes n-type silicon having a low n-type impurity concentration. Also, a concave portion 20b corresponding to the alignment mark 20 is formed on a surface of the first epitaxial layer 40a.

Next, a resist mask having an opening is formed on the first epitaxial layer 40a. A position of the opening is adjusted using the concave portion 20b. Next, p-type impurities (for example, boron and phosphorus) are injected into the first epitaxial layer 40a through the resist mask. Accordingly, as shown in FIG. 9, a p-type region 42 is formed in a part of the first epitaxial layer 40a. In FIG. 9, the p-type region 42 is formed above each of the high concentration regions 30. Also, a method in which a heating time is short and impurities do not easily diffuse is used to activate impurities injected into the first epitaxial layer 40a.

Figure 10:
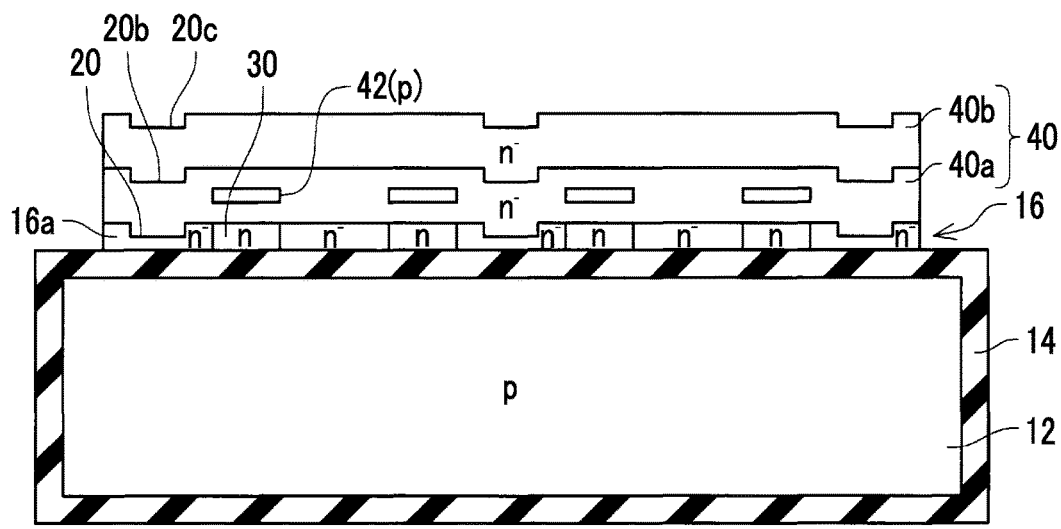
FIG. 10 is a vertical cross-sectional view after a second epitaxial layer 40b is formed.

Next, as shown in FIG. 10, a second epitaxial layer 40b is grown on the first epitaxial layer 40a. The second epitaxial layer 40b includes n-type silicon having a low n-type impurity concentration. Also, a concave portion 20c corresponding to the concave portion 20b is formed on a surface of the second epitaxial layer 40b. The first epitaxial layer 40a and the second epitaxial layer 40b constitute the additional semiconductor layer 40.

Next, impurities are selectively injected into the second epitaxial layer 40b. Accordingly, a semiconductor element (for example, the above-described diode or MOSFET) is formed in the additional semiconductor layer 40. Also, a position of a range in which impurities are injected can be adjusted using the concave portion 20c. Then, when the SOI substrate is diced, the semiconductor device is completed.

According to the method of Example 3, it is possible to form the p-type region 42 at an intermediate depth (above the high concentration region 30) of the device layer. In such a configuration, it is possible to further improve a withstand pressure of the semiconductor element in the vertical direction.

As described above, according to the manufacturing method of Example 3, it is possible to form a semiconductor element having a complex structure by combining a diffusion region in the first epitaxial layer 40a and a diffusion region in the second epitaxial layer 40b. Note that, while the first epitaxial layer 40a and the second epitaxial layer 40b form the additional semiconductor layer 40 in Example 3, three or more epitaxial layers may form the additional semiconductor layer 40.

Also, while concentrations of n-type impurities of the regions 31 to 35 in the high concentration region 30 are set to be different in the above-described example, the n-type impurity concentration may be substantially constant in the high concentration region 30. In this configuration also, it is possible to improve a withstand pressure of the semiconductor element in the vertical direction.

In addition, while the high concentration region 30 is formed in a part of the front side semiconductor layer 16 in the above-described example, the high concentration region 30 may be provided in the entire front side semiconductor layer 16. In such a configuration, in a process of injecting n-type impurities into the front side semiconductor layer 16, the resist mask is not necessary.

In addition, while a case in which the diode and the MOSFET are formed on the device layer has been described in the above-described example, other semiconductor elements may be formed on the device layer.

Technical components disclosed in this specification are listed as follows. Note that the following technical components are independently useful.

In an exemplary manufacturing method disclosed in this specification, in a process of heating an semiconductor substrate, an average diffusion length of impurities in a front side semiconductor layer is twice the thickness of the front side semiconductor layer or more.

In such a configuration, it is possible for an impurity concentration to have a uniform distribution in a high concentration region in a thickness direction of the front side semiconductor layer.

In an exemplary manufacturing method disclosed in this specification, in a process of epitaxially growing an additional semiconductor layer, when epitaxial growing and injection of impurities into an epitaxial layer are repeated, the additional semiconductor layer including a laminate having a plurality of epitaxial layers is formed.

In such a configuration, it is possible to form a complex structure in a device layer. It is possible to manufacture a more complex semiconductor device using this SOI substrate.

In an exemplary manufacturing method disclosed in this specification, the thickness of the additional semiconductor layer is greater than the thickness of the front side semiconductor layer.

In such a configuration, a withstand pressure of the SOI substrate further increases.

While embodiments have been described above in detail, these are only examples and the present disclosure is not limited thereto. The present disclosure includes various modifications and alternations of the specific examples described above. Technical components described in this specification and drawings exhibit technical usefulness independently and in various combinations. In addition, a plurality of objects are achieved at the same time by technology exemplified in this specification and drawings, and when one of the objects is achieved, technical usefulness is provided therein.

What is claimed is:

1. A method of manufacturing a silicon on insulator substrate, comprising:
   (a) preparing a semiconductor substrate including a rear side semiconductor layer, an insulating layer, and a front side semiconductor layer, a first surface of the insulating layer being in contact with a surface of the rear side semiconductor layer, and a first surface of the front side semiconductor layer being in contact with a second surface of the insulating layer;
   (b) forming a high concentration region in the front side semiconductor layer, including a plurality of regions arranged in a lateral direction of the front side semiconductor layer, in which an impurity concentration is increased, by repeatedly injecting impurities into the front side semiconductor layer while changing an area of the front side semiconductor layer into which the impurities are injected, one of the plurality of regions having a different impurity concentration than another of the plurality of regions, and the impurities being n-type impurities or p-type impurities;
   (c) heating the semiconductor substrate having the high concentration region; and
   (d) epitaxially growing an additional semiconductor layer on a second surface of the front side semiconductor layer of the heated semiconductor substrate, the additional semiconductor layer having a lower impurity concentration than the high concentration region;
   wherein, in step (c), an average diffusion length of impurities in the front side semiconductor layer is twice a thickness of the front side semiconductor layer or more.

2. The manufacturing method according to claim 1, wherein step (d) includes forming the additional semiconductor layer including a laminate of a plurality of epitaxial layers by repeating epitaxial growing an epitaxial layer and injection of impurities into the epitaxial layer.

3. The manufacturing method according to claim 1, wherein
   a thickness of the additional semiconductor layer is greater than a thickness of the front side semiconductor layer.

4. The manufacturing method according to claim 1, further comprising
   (e) forming a concave portion in the second surface of the front side semiconductor layer before step (b).

5. The manufacturing method according to claim 1, wherein step (b) includes:
   forming a resist mask having an opening on the second surface of the front side semiconductor layer; and
   injecting impurities into the front side semiconductor layer through the opening.

6. The manufacturing method according to claim 5, wherein
   step (b) includes forming an oxide film on the second surface of the front side semiconductor layer before the resist mask is formed,
   the resist mask is formed on the oxide film, and
   the impurities are injected into the front side semiconductor layer through the oxide film.

7. A method of manufacturing a silicon on insulator substrate, comprising:
   (a) preparing a semiconductor substrate including a rear side semiconductor layer, an insulating layer, and a front side semiconductor layer, a first surface of the insulating layer being in contact with a surface of the rear side semiconductor layer, and a first surface of the front side semiconductor layer being in contact with a second surface of the insulating layer;
   (b) forming a high concentration region in the front side semiconductor layer, including a plurality of regions arranged in a lateral direction of the front side semiconductor layer, in which an impurity concentration is increased, by repeatedly injecting impurities into the front side semiconductor layer while changing an area of the front side semiconductor layer into which the impurities are injected, one of the plurality of regions having a different impurity concentration than another of the plurality of regions, and the impurities being n-type impurities or p-type impurities;
   (c) heating the semiconductor substrate having the high concentration region; and
   (d) epitaxially growing an additional semiconductor layer on a second surface of the front side semiconductor layer of the heated semiconductor substrate, the additional semiconductor layer having a lower impurity concentration than the high concentration region.

* * * * *